US 6,693,033 B2

(12) United States Patent
Edwards, Jr. et al.

(10) Patent No.: US 6,693,033 B2
(45) Date of Patent: Feb. 17, 2004

(54) METHOD OF REMOVING AN AMORPHOUS OXIDE FROM A MONOCRYSTALLINE SURFACE

(75) Inventors: John L. Edwards, Jr., Phoenix, AZ (US); Yi Wei, Chandler, AZ (US); Dirk C. Jordan, Gilbert, AZ (US); Xiaoming Hu, Chandler, AZ (US); James Bradley Craigo, Tempe, AZ (US); Ravindranath Droopad, Chandler, AZ (US); Zhiyi Yu, Gilbert, AZ (US); Alexander A. Demkov, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/983,854

(22) Filed: Oct. 26, 2001

(65) Prior Publication Data

US 2002/0072253 A1 Jun. 13, 2002

Related U.S. Application Data

(63) Continuation-in-part of application No. 09/502,023, filed on Feb. 10, 2000.

(51) Int. Cl.[7] .................. H01L 21/20; H01L 21/36; H01L 21/302; H01L 21/461
(52) U.S. Cl. .................. 438/690; 438/478; 438/488
(58) Field of Search .................. 438/478, 572, 438/488, 575, 690; 428/446, 472; 177/105, 84

(56) References Cited

U.S. PATENT DOCUMENTS

| 3,670,213 | A | 6/1972 | Nakawaga et al. |
|---|---|---|---|
| 3,766,370 | A | 10/1973 | Walther |
| 3,802,967 | A | 4/1974 | Ladany et al. |
| 3,914,137 | A | 10/1975 | Huffman et al. |
| 3,935,031 | A | 1/1976 | Adler |
| 4,006,989 | A | 2/1977 | Andringa |
| 4,084,130 | A | 4/1978 | Holton |
| 4,120,588 | A | 10/1978 | Chaum |
| 4,146,297 | A | 3/1979 | Alferness et al. |
| 4,174,422 | A | 11/1979 | Matthews et al. |
| 4,242,595 | A | 12/1980 | Lehovec |
| 4,284,329 | A | 8/1981 | Smith et al. |
| 4,289,920 | A | 9/1981 | Hovel |
| 4,297,656 | A | 10/1981 | Pan |

(List continued on next page.)

FOREIGN PATENT DOCUMENTS

DE 196 07 107 8/1997

(List continued on next page.)

OTHER PUBLICATIONS

Kaushik et al., Device Characteristics of Crystalline Epitaxial Oxides on Silicon Jun. 19–21, 2000, 58th Annual Device Research Conference, pp. 17–20.*
Moon et al., Roles of Buffer Layers in Epitaxial Growth of SrTiO3 Films on Silicon Substrates, Mar. 1994, Jpn J. Appl. Phys., vol. 33 pp. 1472–1477.*

(List continued on next page.)

Primary Examiner—John F. Niebling
Assistant Examiner—Walter L. Lindsay, Jr.
(74) Attorney, Agent, or Firm—Oblon, Spivak, McClelland, Maier & Neustadt, P.C.

(57) ABSTRACT

A method of removing an amorphous oxide from a surface of a monocrystalline substrate is provided. The method includes depositing a passivation material overlying the amorphous oxide. The monocrystalline substrate is then heated so that the amorphous oxide layer decomposes into at least one volatile species that is liberated from the surface.

29 Claims, 1 Drawing Sheet

U.S. PATENT DOCUMENTS

| | | | |
|---|---|---|---|
| 4,392,297 A | 7/1983 | Little | |
| 4,398,342 A | 8/1983 | Pitt et al. | |
| 4,404,265 A | 9/1983 | Manasevit | |
| 4,424,589 A | 1/1984 | Thomas et al. | |
| 4,439,014 A | 3/1984 | Stacy et al. | |
| 4,442,590 A | 4/1984 | Stockton et al. | |
| 4,452,720 A | 6/1984 | Harada et al. | |
| 4,459,325 A | 7/1984 | Nozawa et al. | |
| 4,482,422 A | 11/1984 | McGinn et al. | |
| 4,482,906 A | 11/1984 | Hovel et al. | |
| 4,484,332 A | 11/1984 | Hawrylo | |
| 4,503,540 A | 3/1985 | Nakashima et al. | |
| 4,523,211 A | 6/1985 | Morimoto et al. | |
| 4,594,000 A | 6/1986 | Falk et al. | |
| 4,629,821 A | 12/1986 | Bronstein-Bonte et al. | |
| 4,661,176 A | 4/1987 | Manasevit | |
| 4,667,088 A | 5/1987 | Kramer | |
| 4,667,212 A | 5/1987 | Nakamura | |
| 4,681,982 A | 7/1987 | Yoshida | |
| 4,748,485 A | 5/1988 | Vasudev | |
| 4,756,007 A | 7/1988 | Qureshi et al. | |
| 4,772,929 A | 9/1988 | Manchester et al. | |
| 4,773,063 A | 9/1988 | Hunsperger et al. | |
| 4,774,205 A | 9/1988 | Choi et al. | |
| 4,777,613 A | 10/1988 | Shahan et al. | |
| 4,793,872 A | 12/1988 | Meunier et al. | |
| 4,802,182 A | 1/1989 | Thornton et al. | |
| 4,815,084 A | 3/1989 | Scifres et al. | |
| 4,841,775 A | 6/1989 | Ikeda et al. | |
| 4,845,044 A | 7/1989 | Ariyoshi et al. | |
| 4,846,926 A | 7/1989 | Kay et al. | |
| 4,855,249 A | 8/1989 | Akasaki et al. | |
| 4,868,376 A | 9/1989 | Lessin et al. | |
| 4,872,046 A | 10/1989 | Morkoc et al. | |
| 4,876,208 A | 10/1989 | Gustafson et al. | |
| 4,876,219 A | 10/1989 | Eshita et al. | |
| 4,882,300 A | 11/1989 | Inoue et al. | |
| 4,885,376 A | 12/1989 | Verkade | |
| 4,888,202 A | 12/1989 | Murakami et al. | |
| 4,889,402 A | 12/1989 | Reinhart | |
| 4,891,091 A | 1/1990 | Shastry | |
| 4,896,194 A | 1/1990 | Suzuki | |
| 4,901,133 A | 2/1990 | Curran et al. | |
| 4,910,164 A | 3/1990 | Shichijo | |
| 4,912,087 A | 3/1990 | Aslam et al. | |
| 4,928,154 A | 5/1990 | Umeno et al. | |
| 4,934,777 A | 6/1990 | Jou et al. | |
| 4,952,420 A | 8/1990 | Walters | |
| 4,959,702 A | 9/1990 | Moyer et al. | |
| 4,963,508 A | 10/1990 | Umeno et al. | |
| 4,963,949 A | 10/1990 | Wanlass et al. | |
| 4,965,649 A | 10/1990 | Zanio et al. | |
| 4,981,714 A | 1/1991 | Ohno et al. | |
| 4,984,043 A | 1/1991 | Vinal | |
| 4,999,842 A | 3/1991 | Huang et al. | |
| 5,018,816 A | 5/1991 | Murray et al. | |
| 5,028,976 A | 7/1991 | Ozaki et al. | |
| 5,051,790 A | 9/1991 | Hammer | |
| 5,053,835 A | 10/1991 | Horikawa et al. | |
| 5,055,445 A | 10/1991 | Belt et al. | |
| 5,055,835 A | 10/1991 | Sutton | |
| 5,060,031 A | 10/1991 | Abrokwah et al. | |
| 5,063,081 A | 11/1991 | Cozzette et al. | |
| 5,063,166 A | 11/1991 | Mooney et al. | |
| 5,067,809 A | 11/1991 | Tsubota | |
| 5,073,981 A | 12/1991 | Giles et al. | |
| 5,075,743 A | 12/1991 | Behfar-Rad | |
| 5,081,062 A | 1/1992 | Vasudev et al. | |
| 5,081,519 A | 1/1992 | Nishimura et al. | |
| 5,103,494 A | 4/1992 | Mozer | |
| 5,116,461 A | 5/1992 | Lebby et al. | |
| 5,119,448 A | 6/1992 | Schaefer et al. | |
| 5,122,852 A | 6/1992 | Chan et al. | |
| 5,127,067 A | 6/1992 | Delcoco et al. | |
| 5,130,762 A | 7/1992 | Kulick | |
| 5,132,648 A | 7/1992 | Trinh et al. | |
| 5,140,651 A | 8/1992 | Soref et al. | |
| 5,141,894 A | 8/1992 | Bisaro et al. | |
| 5,143,854 A | 9/1992 | Pirrung et al. | |
| 5,144,409 A | 9/1992 | Ma | |
| 5,155,658 A | 10/1992 | Inam et al. | |
| 5,159,413 A | 10/1992 | Calviello et al. | |
| 5,163,118 A | 11/1992 | Lorenzo et al. | |
| 5,173,474 A | 12/1992 | Connell et al. | |
| 5,173,835 A | 12/1992 | Cornett et al. | |
| 5,181,085 A | 1/1993 | Moon et al. | |
| 5,185,589 A | 2/1993 | Krishnaswamy et al. | |
| 5,191,625 A | 3/1993 | Gustavsson | |
| 5,194,397 A | 3/1993 | Cook et al. | |
| 5,194,917 A | 3/1993 | Regener | |
| 5,198,269 A | 3/1993 | Swartz et al. | |
| 5,208,182 A | 5/1993 | Narayan et al. | |
| 5,210,763 A | 5/1993 | Lewis et al. | |
| 5,216,729 A | 6/1993 | Berger et al. | |
| 5,221,367 A | 6/1993 | Chisholm et al. | |
| 5,225,031 A | 7/1993 | McKee et al. | |
| 5,227,196 A | 7/1993 | Itoh | |
| 5,244,818 A | 9/1993 | Jokers et al. | |
| 5,248,564 A | 9/1993 | Ramesh | |
| 5,260,394 A | 11/1993 | Tazaki et al. | |
| 5,266,355 A | 11/1993 | Wernberg et al. | |
| 5,270,298 A | 12/1993 | Ramesh | |
| 5,280,013 A | 1/1994 | Newman et al. | |
| 5,281,834 A | 1/1994 | Cambou et al. | |
| 5,283,462 A | 2/1994 | Stengel | |
| 5,286,985 A | 2/1994 | Taddiken | |
| 5,293,050 A | 3/1994 | Chapple-Sokol et al. | |
| 5,306,649 A | 4/1994 | Hebert | |
| 5,310,707 A | 5/1994 | Oishi et al. | |
| 5,312,765 A | 5/1994 | Kanber | |
| 5,314,547 A | 5/1994 | Heremans et al. | |
| 5,323,023 A | 6/1994 | Fork | |
| 5,326,721 A | 7/1994 | Summerfelt | |
| 5,334,556 A | 8/1994 | Guldi | |
| 5,352,926 A | 10/1994 | Andrews | |
| 5,356,509 A | 10/1994 | Terranova et al. | |
| 5,356,831 A | * 10/1994 | Calviello et al. | ............ 117/105 |
| 5,357,122 A | 10/1994 | Okubora et al. | |
| 5,358,925 A | 10/1994 | Neville Connell et al. | |
| 5,371,734 A | 12/1994 | Fischer | |
| 5,372,992 A | 12/1994 | Itozaki et al. | |
| 5,373,166 A | 12/1994 | Buchan et al. | |
| 5,391,515 A | 2/1995 | Kao et al. | |
| 5,393,352 A | 2/1995 | Summerfelt | |
| 5,394,489 A | 2/1995 | Koch | |
| 5,395,663 A | 3/1995 | Tabata et al. | |
| 5,397,428 A | * 3/1995 | Stoner et al. | ................ 427/577 |
| 5,399,898 A | 3/1995 | Rostoker | |
| 5,404,581 A | 4/1995 | Honjo | |
| 5,405,802 A | 4/1995 | Yamagata et al. | |
| 5,406,202 A | 4/1995 | Mehrgardt et al. | |
| 5,418,216 A | 5/1995 | Fork | |
| 5,418,389 A | 5/1995 | Watanabe | |
| 5,420,102 A | 5/1995 | Harshavardhan et al. | |
| 5,427,988 A | 6/1995 | Sengupta et al. | |
| 5,436,759 A | 7/1995 | Dijaili et al. | |
| 5,438,584 A | 8/1995 | Paoli et al. | |
| 5,441,577 A | 8/1995 | Sasaki et al. | |
| 5,442,191 A | 8/1995 | Ma | |
| 5,442,561 A | 8/1995 | Yoshizawa et al. | |
| 5,444,016 A | 8/1995 | Abrokwah et al. | |

| | | | | | | |
|---|---|---|---|---|---|---|
| 5,450,812 A | 9/1995 | McKee et al. | | 5,689,123 A | 11/1997 | Major et al. |
| 5,452,118 A | 9/1995 | Maruska | | 5,725,641 A | 3/1998 | MacLeod |
| 5,453,727 A | 9/1995 | Shibasaki et al. | | 5,729,394 A | 3/1998 | Sevier et al. |
| 5,466,631 A | 11/1995 | Ichikawa et al. | | 5,729,641 A | 3/1998 | Chandonnet et al. |
| 5,473,047 A | 12/1995 | Shi | | 5,731,220 A | 3/1998 | Tsu et al. |
| 5,473,171 A | 12/1995 | Summerfelt | | 5,733,641 A | 3/1998 | Fork et al. |
| 5,478,653 A * | 12/1995 | Guenzer .................. 428/446 | | 5,734,672 A | 3/1998 | McMinn et al. |
| 5,479,033 A | 12/1995 | Baca et al. | | 5,735,949 A | 4/1998 | Mantl et al. |
| 5,479,317 A | 12/1995 | Ramesh | | 5,741,724 A | 4/1998 | Ramdani et al. |
| 5,480,829 A | 1/1996 | Abrokwah et al. | | 5,745,631 A | 4/1998 | Reinker |
| 5,481,102 A | 1/1996 | Hazelrigg, Jr. | | 5,753,300 A | 5/1998 | Wessels et al. |
| 5,482,003 A | 1/1996 | McKee et al. | | 5,753,928 A | 5/1998 | Krause |
| 5,484,664 A | 1/1996 | Kitahara et al. | | 5,754,319 A | 5/1998 | Van De Voorde et al. |
| 5,486,406 A | 1/1996 | Shi | | 5,760,426 A | 6/1998 | Marx et al. |
| 5,491,461 A | 2/1996 | Partin et al. | | 5,760,427 A | 6/1998 | Onda |
| 5,492,859 A | 2/1996 | Sakaguchi et al. | | 5,764,676 A | 6/1998 | Paoli et al. |
| 5,494,711 A | 2/1996 | Takeda et al. | | 5,767,543 A | 6/1998 | Ooms et al. |
| 5,504,035 A | 4/1996 | Rostoker et al. | | 5,770,887 A | 6/1998 | Tadatomo et al. |
| 5,504,183 A | 4/1996 | Shi | | 5,776,359 A | 7/1998 | Schultz et al. |
| 5,511,238 A | 4/1996 | Bayraktaroglu | | 5,776,621 A | 7/1998 | Nashimoto |
| 5,512,773 A | 4/1996 | Wolf et al. | | 5,777,350 A | 7/1998 | Nakamura et al. |
| 5,514,484 A | 5/1996 | Nashimoto | | 5,777,762 A | 7/1998 | Yamamoto |
| 5,514,904 A | 5/1996 | Onga et al. | | 5,778,018 A | 7/1998 | Yoshikawa et al. |
| 5,515,047 A | 5/1996 | Yamakido et al. | | 5,778,116 A | 7/1998 | Tomich |
| 5,515,810 A | 5/1996 | Yamashita et al. | | 5,780,311 A | 7/1998 | Beasom et al. |
| 5,516,725 A * | 5/1996 | Chang et al. ............... 438/572 | | 5,789,733 A | 8/1998 | Jachimowicz et al. |
| 5,519,235 A | 5/1996 | Ramesh | | 5,789,845 A | 8/1998 | Wadaka et al. |
| 5,528,057 A | 6/1996 | Yanagase et al. | | 5,790,583 A | 8/1998 | Ho |
| 5,528,067 A | 6/1996 | Farb et al. | | 5,792,569 A | 8/1998 | Sun et al. |
| 5,528,414 A | 6/1996 | Oakley | | 5,792,679 A | 8/1998 | Nakato |
| 5,530,235 A | 6/1996 | Stefik et al. | | 5,796,648 A | 8/1998 | Kawakubo et al. |
| 5,538,941 A | 7/1996 | Findikoglu et al. | | 5,801,072 A | 9/1998 | Barber |
| 5,541,422 A | 7/1996 | Wolf et al. | | 5,801,105 A | 9/1998 | Yano et al. |
| 5,549,977 A | 8/1996 | Jin et al. | | 5,807,440 A | 9/1998 | Kubota et al. |
| 5,551,238 A | 9/1996 | Prueitt | | 5,810,923 A | 9/1998 | Yano et al. |
| 5,552,547 A | 9/1996 | Shi | | 5,812,272 A | 9/1998 | King et al. |
| 5,553,089 A | 9/1996 | Seki et al. | | 5,814,583 A | 9/1998 | Itozaki et al. |
| 5,556,463 A | 9/1996 | Guenzer | | 5,825,055 A | 10/1998 | Summerfelt |
| 5,561,305 A | 10/1996 | Smith | | 5,825,799 A | 10/1998 | Ho et al. |
| 5,569,953 A | 10/1996 | Kikkawa et al. | | 5,827,755 A | 10/1998 | Yonchara et al. |
| 5,572,052 A | 11/1996 | Kashihara et al. | | 5,828,080 A | 10/1998 | Yano et al. |
| 5,576,879 A | 11/1996 | Nashimoto | | 5,830,270 A | 11/1998 | McKee et al. |
| 5,588,995 A | 12/1996 | Sheldon | | 5,833,603 A | 11/1998 | Kovacs et al. |
| 5,589,284 A | 12/1996 | Summerfelt et al. | | 5,834,362 A | 11/1998 | Miyagaki et al. |
| 5,596,205 A | 1/1997 | Reedy et al. | | 5,838,035 A | 11/1998 | Ramesh |
| 5,596,214 A | 1/1997 | Endo | | 5,844,260 A | 12/1998 | Ohori |
| 5,602,418 A | 2/1997 | Imai et al. | | 5,846,846 A | 12/1998 | Suh et al. |
| 5,603,764 A | 2/1997 | Matsuda et al. | | 5,852,687 A | 12/1998 | Wickham |
| 5,606,184 A | 2/1997 | Abrokwah et al. | | 5,857,049 A | 1/1999 | Beranek et al. |
| 5,608,046 A | 3/1997 | Cook et al. | | 5,858,814 A | 1/1999 | Goossen et al. |
| 5,610,744 A | 3/1997 | Ho et al. | | 5,861,966 A | 1/1999 | Ortel |
| 5,614,739 A | 3/1997 | Abrokwah et al. | | 5,863,326 A | 1/1999 | Nause et al. |
| 5,619,051 A | 4/1997 | Endo | | 5,869,845 A | 2/1999 | Vander Wagt et al. |
| 5,621,227 A | 4/1997 | Joshi | | 5,872,493 A | 2/1999 | Ella |
| 5,623,439 A | 4/1997 | Gotoh et al. | | 5,873,977 A | 2/1999 | Desu et al. |
| 5,623,552 A | 4/1997 | Lane | | 5,874,860 A | 2/1999 | Brunel et al. |
| 5,629,534 A | 5/1997 | Inuzuka et al. | | 5,879,956 A | 3/1999 | Seon et al. |
| 5,633,724 A | 5/1997 | King et al. | | 5,880,452 A | 3/1999 | Plesko |
| 5,635,433 A | 6/1997 | Sengupta | | 5,883,564 A | 3/1999 | Partin |
| 5,640,267 A | 6/1997 | May et al. | | 5,883,996 A | 3/1999 | Knapp et al. |
| 5,650,646 A | 7/1997 | Summerfelt | | 5,886,867 A | 3/1999 | Chivukula et al. |
| 5,656,382 A | 8/1997 | Nashimoto | | 5,888,296 A | 3/1999 | Ooms et al. |
| 5,659,180 A | 8/1997 | Shen et al. | | 5,889,296 A | 3/1999 | Imamura et al. |
| 5,661,112 A | 8/1997 | Hatta et al. | | 5,896,476 A | 4/1999 | Wisseman et al. |
| 5,668,048 A | 9/1997 | Kondo et al. | | 5,907,792 A | 5/1999 | Droopad et al. |
| 5,670,798 A | 9/1997 | Schetzina | | 5,912,068 A | 6/1999 | Jia |
| 5,670,800 A | 9/1997 | Nakao et al. | | 5,926,493 A | 7/1999 | O'Brien et al. |
| 5,674,366 A | 10/1997 | Hayashi et al. | | 5,926,496 A | 7/1999 | Ho et al. |
| 5,679,965 A | 10/1997 | Schetzina | | 5,937,274 A | 8/1999 | Kondow et al. |
| 5,682,046 A | 10/1997 | Takahashi et al. | | 5,937,285 A | 8/1999 | Abrokwah et al. |
| 5,686,741 A | 11/1997 | Ohori et al. | | 5,948,161 A | 9/1999 | Kizuki |

| | | |
|---|---|---|
| 5,953,468 A | 9/1999 | Finnila et al. |
| 5,955,591 A | 9/1999 | Imbach et al. |
| 5,959,879 A | 9/1999 | Koo |
| 5,962,069 A | 10/1999 | Schindler et al. |
| 5,963,291 A | 10/1999 | Wu et al. |
| 5,966,323 A | 10/1999 | Chen et al. |
| 5,977,567 A | 11/1999 | Verdiell |
| 5,981,400 A | 11/1999 | Lo |
| 5,981,976 A | 11/1999 | Murasato |
| 5,981,980 A | 11/1999 | Miyajima et al. |
| 5,984,190 A | 11/1999 | Nevill |
| 5,987,011 A | 11/1999 | Toh |
| 5,990,495 A | 11/1999 | Ohba |
| 5,995,359 A | 11/1999 | Klee et al. |
| 5,995,528 A | 11/1999 | Fukunaga et al. |
| 6,002,375 A | 12/1999 | Corman et al. |
| 6,008,762 A | 12/1999 | Nghiem |
| 6,011,641 A | 1/2000 | Shin et al. |
| 6,011,646 A | 1/2000 | Mirkarimi et al. |
| 6,013,553 A | 1/2000 | Wallace et al. |
| 6,020,222 A | 2/2000 | Wollesen |
| 6,022,140 A | 2/2000 | Fraden et al. |
| 6,022,410 A | 2/2000 | Yu et al. |
| 6,022,963 A | 2/2000 | McGall et al. |
| 6,023,082 A | 2/2000 | McKee et al. |
| 6,028,853 A | 2/2000 | Haartsen |
| 6,039,803 A | 3/2000 | Fitzgerald et al. |
| 6,045,626 A | 4/2000 | Yano et al. |
| 6,046,464 A | 4/2000 | Schetzina |
| 6,048,751 A | 4/2000 | D'Asaro et al. |
| 6,049,702 A | 4/2000 | Tham et al. |
| 6,051,858 A | 4/2000 | Uchida et al. |
| 6,055,179 A | 4/2000 | Koganei et al. |
| 6,058,131 A | 5/2000 | Pan |
| 6,064,078 A | 5/2000 | Northrup et al. |
| 6,064,092 A | 5/2000 | Park |
| 6,078,717 A | 6/2000 | Nashimoto et al. |
| 6,083,697 A | 7/2000 | Beecher et al. |
| 6,087,681 A | 7/2000 | Shakuda |
| 6,088,216 A | 7/2000 | Laibowitz et al. |
| 6,090,659 A | 7/2000 | Laibowitz et al. |
| 6,093,302 A | 7/2000 | Montgomery |
| 6,096,584 A | 8/2000 | Ellis-Monaghan et al. |
| 6,100,578 A | 8/2000 | Suzuki |
| 6,103,008 A | 8/2000 | McKee et al. |
| 6,103,403 A | 8/2000 | Grigorian et al. |
| 6,107,653 A | 8/2000 | Fitzgerald |
| 6,107,721 A | 8/2000 | Lakin |
| 6,108,125 A | 8/2000 | Yano |
| 6,113,690 A | 9/2000 | Yu et al. |
| 6,114,996 A | 9/2000 | Nghiem |
| 6,121,642 A | 9/2000 | Newns |
| 6,121,647 A | 9/2000 | Yano et al. |
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,910 B1 | 5/2001 | Bell et al. |
| 6,235,145 B1 | 5/2001 | Li et al. |
| 6,238,946 B1 | 5/2001 | Ziegler |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,253,649 B1 | 7/2001 | Kawahara et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,291,319 B1 | 9/2001 | Yu et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,338,756 B2 * | 1/2002 | Dietze .................. 117/84 |
| 6,339,664 B1 | 1/2002 | Farjady et al. |
| 6,340,788 B1 | 1/2002 | King et al. |
| 6,343,171 B1 | 1/2002 | Yoshimura et al. |
| 6,345,424 B1 * | 2/2002 | Hasegawa et al. ......... 29/25.35 |
| 6,348,373 B1 | 2/2002 | Ma et al. |
| 6,359,330 B1 | 3/2002 | Goudard |
| 6,362,017 B1 | 3/2002 | Manabe et al. |
| 6,367,699 B2 | 4/2002 | Ackley |
| 6,372,356 B1 | 4/2002 | Thornton et al. |
| 6,372,813 B1 | 4/2002 | Johnson et al. |
| 6,389,209 B1 | 5/2002 | Suhir |
| 6,391,674 B2 | 5/2002 | Ziegler |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 * | 6/2002 | Taylor et al. ............... 257/441 |
| 6,410,947 B1 | 6/2002 | Wada |
| 6,411,756 B2 | 6/2002 | Sadot et al. |
| 6,417,059 B2 | 7/2002 | Huang |
| 6,427,066 B1 * | 7/2002 | Grube .................. 438/478 |
| 6,432,546 B1 * | 8/2002 | Ramesh et al. ............ 428/472 |
| 6,438,281 B1 | 8/2002 | Tsukamoto et al. |
| 6,461,927 B1 | 10/2002 | Mochizuki et al. |
| 6,462,360 B1 | 10/2002 | Higgins, Jr. et al. |
| 2001/0013313 A1 | 8/2001 | Droopad et al. |

| | | | | | |
|---|---|---|---|---|---|
| 2002/0006245 A1 | 1/2002 | Kubota et al. | JP | 5-086477 | 4/1993 |
| 2002/0008234 A1 | 1/2002 | Emrick | JP | 05150143 | 6/1993 |
| 2002/0030246 A1 | 3/2002 | Eisenbeiser et al. | JP | 5-152529 | 6/1993 |
| 2002/0047123 A1 | 4/2002 | Ramdani et al. | JP | 5-291299 | 11/1993 |
| 2002/0047143 A1 | 4/2002 | Ramdani et al. | JP | 06-069490 | 3/1994 |
| 2002/0072245 A1 | 6/2002 | Ooms et al. | JP | 6-232126 | 8/1994 |
| 2002/0131675 A1 | 9/2002 | Litvin | JP | 6-291299 | 10/1994 |
| | | | JP | 6-334168 | 12/1994 |

FOREIGN PATENT DOCUMENTS

| | | |
|---|---|---|
| JP | 0812494 | 1/1996 |
| JP | 9-67193 | 3/1997 |
| DE | 197 12 496 | 10/1997 |
| JP | 9-82913 | 3/1997 |
| DE | 100 17 137 | 10/2000 |
| JP | 10-256154 | 9/1998 |
| EP | 0 250 171 | 12/1987 |
| JP | 10-303396 | 11/1998 |
| EP | 0 300 499 | 1/1989 |
| JP | 10-321943 | 12/1998 |
| EP | 0 309 270 | 3/1989 |
| JP | 11135614 | 5/1999 |
| EP | 0 331 467 | 9/1989 |
| JP | 11-238683 | 8/1999 |
| EP | 0 342 937 | 11/1989 |
| JP | 11-260835 | 9/1999 |
| EP | 0 455 526 | 6/1991 |
| JP | 11340542 | 12/1999 |
| EP | 0 483 993 | 5/1992 |
| JP | 2000-068466 | 3/2000 |
| EP | 0 514 018 | 11/1992 |
| JP | 2 000 1645 | 6/2000 |
| EP | 0 538 611 | 4/1993 |
| JP | 2000-351692 | 12/2000 |
| EP | 0 581 239 | 2/1994 |
| JP | 2002-9366 | 1/2002 |
| EP | 0 602 568 | 6/1994 |
| WO | WO 92/10875 | 6/1992 |
| EP | 0 607 435 | 7/1994 |
| WO | WO 93/07647 | 4/1993 |
| EP | 0 630 057 | 12/1994 |
| WO | WO 94/03908 | 2/1994 |
| EP | 0 682 266 | 11/1995 |
| WO | WO 97/45827 | 12/1997 |
| EP | 0 711 853 | 5/1996 |
| WO | WO 98/05807 | 1/1998 |
| EP | 0 777 379 | 6/1997 |
| WO | WO 98/20606 | 5/1998 |
| EP | 0 810 666 | 12/1997 |
| WO | WO 99/14797 | 3/1999 |
| EP | 0 875 922 | 11/1998 |
| WO | WO 99/14804 | 3/1999 |
| EP | 0 881 669 | 12/1998 |
| WO | WO 99/19546 | 4/1999 |
| EP | 0 884 767 | 12/1998 |
| WO | WO 99/63580 | 12/1999 |
| EP | 0 926 739 | 6/1999 |
| WO | WO 00/06812 | 2/2000 |
| EP | 0 957 522 | 11/1999 |
| WO | WO 00/16378 | 3/2000 |
| EP | 0 964 259 | 12/1999 |
| WO | WO 00/33363 | 6/2000 |
| EP | 0 964 453 | 12/1999 |
| WO | WO 00/48239 | 8/2000 |
| EP | 0 993 027 | 4/2000 |
| WO | WO 01/04943 A1 | 1/2001 |
| EP | 0 999 600 | 5/2000 |
| WO | WO 01/16395 | 3/2001 |
| EP | 1 001 468 | 5/2000 |
| WO | WO 01/33585 | 5/2001 |
| EP | 1 043 426 | 10/2000 |
| WO | WO 01/37330 | 5/2001 |
| EP | 1 043 765 | 10/2000 |
| WO | WO 01/59814 A2 | 8/2001 |
| EP | 1 069 606 | 1/2001 |
| WO | WO 01/59820 A1 | 8/2001 |
| EP | 1 085 319 | 3/2001 |
| WO | WO 01/59821 A1 | 8/2001 |
| EP | 1 109 212 | 6/2001 |
| WO | WO 02 01648 | 1/2002 |
| FR | 2 779 843 | 12/1999 |
| WO | WO 02/03113 | 1/2002 |
| GB | 1 319 311 | 6/1970 |
| WO | WO 02/03467 | 1/2002 |
| GB | 2 335 792 | 9/1999 |
| WO | WO 02/03480 | 1/2002 |
| JP | 52-88354 | 7/1977 |
| WO | WO 02/09160 A2 | 1/2002 |
| JP | 52-89070 | 7/1977 |
| WO | WO 02/33385 A2 | 4/2002 |
| JP | 52-135684 | 11/1977 |
| WO | WO 02/47127 A2 | 6/2002 |
| JP | 54-134554 | 10/1979 |
| WO | WO 02/50879 | 6/2002 |
| JP | 55-87424 | 7/1980 | | | |
| JP | 58-075868 | 5/1983 | | | |
| JP | 58-213412 | 12/1983 | | | |
| JP | 60-210018 | 10/1985 | | | |
| JP | 60-212018 | 10/1985 | | | |
| JP | 61-36981 | 2/1986 | | | |
| JP | 61-63015 | 4/1986 | | | |
| JP | 61-108187 | 5/1986 | | | |
| JP | 63-34994 | 2/1988 | | | |
| JP | 63-131104 | 6/1988 | | | |
| JP | 63-198365 | 8/1988 | | | |
| JP | 63-289812 | 11/1988 | | | |
| JP | 64-50575 | 2/1989 | | | |
| JP | 64-52329 | 2/1989 | | | |
| JP | 1-102435 | 4/1989 | | | |
| JP | 1-179411 | 7/1989 | | | |
| JP | HEI 2-391 | 1/1990 | | | |
| JP | 02051220 | 2/1990 | | | |
| JP | 3-41783 | 2/1991 | | | |
| JP | 03-188619 | 8/1991 | | | |
| JP | 5-48072 | 2/1993 | | | |

OTHER PUBLICATIONS

Nakagawara et al., Effects of Buffer Layers in Epitaxial Growth of $SrTiO_3$ Thin Film on Si(100), *J. Appl. Phys.*, 78(12), Dec. 15, 1995, pp. 7226–7230.

Suzuki et al., "A Proposal of Epitaxial Oxide Thin Film Structures For Future Oxide Electronics," *Materials Science and Engineering B41,* (1996), pp. 166–173.

W. F. Egelhoff et al., "Optimizing GMR Spin Valves: The Outlook for Improved Properties", *1998 Int'l Non Volatile Memory Technology Conference,* pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters,* vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52(9), Feb. 29, 1998, pp. 709–711.

M. Rotter et al., "Single Chip Fused Hybrids for Acousto–Electric and Acousto–Optic Applications," *1997 Applied Physics Letters,* vol. 70(16), Apr. 21, 1997, pp. 2097–2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric,* vol. 224, pp. 275–282, 1999.

S. Mathews et al., "Ferroelectric Field Effect Transistor based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences,* vol. 16, Issue 2, 1990, pp. 91–114.

S. F. Fang et al., "Gallium Arsenide and Other Compound Semiconductors on Silicon," *J. Appl Phys.,* 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter,* vol. 76, No. 14, Apr. 2000, pp. 1884–1886.

Ringel et al., "Epitaxial Integration of III–V materials and Devices with Si Using Graded GeSi Buffers," $27^{th}$ International Symposium on Compound Semiconductors, Oct. 2000.

Zogg et al., "Progress in Compound–Semiconductor–on––Silicon–Heteroepitaxy with Fluroide Buffer Layers," *J. Electrochem Soc.,* vol. 136, No. 3, Mar. 1998, pp. 775–779.

Xiong et al., "Oxide Defined GaAs Vertical–Cavity Surface–Emitting Lasers on Substrates," *IEEE Photonics Technology Letters,* vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.,* vol. 541, pp. 661–666, 1999.

Gunapala et al., "Bound–To–Quasi–Bound Qauntum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering,* vol. 2999, pp. 211–224.

Bruley et al., "Nanostructure and Chemistry of a (100)MgO/(100) GaAs Interface," *Appl. Phys Lett,* 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.,* 58(20), May 20, 1991, pp. 2294–2296.

Himpsel et al., "Dialectrics on Semiconductors," *Materials Science and Engineering,* B1(1998), pp. 9–13.

Li et al., "Epitaxial La$_{0.67}$Sr$_{0.33}$Mno$_3$ Magnetic Tunnel Junctions," *J. Appl. Phys.* 81(8), Apr. 15, 1997, pp. 5509–5511.

O'Donnell et al., "Clossal Magnetoresistance Magnetic Tunnel Junctions Grown by Molecular–Beam Epitaxy," *Appl. Physics Letters,* vol. 76, No. 14, Apr. 3, 2000, pp. 1914–1916.

Mikami et al., "Formation of Si Epi/MgO–Al$_2$O$_3$Eip./SiO$_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF$_2$ and Silicon," *Thin Solid Films,* vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.,* vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications,* vol. 108, No. 4, pp. 225–227, 1998.

R.A. Morgan et al., "Vertical–Cavity Surface–Emitting Lasers Come of Age," *SPIE,* vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated Mems Switch for Power Applications"; IEEE, 2000, pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21. No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, $7^{th}$ Int'l Workshop on, 2000; pp. 64–65.

S.S. Lu, et al.; "Piezoelectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, $12^{th}$ Ma 1994, vol. 30, No. 10; pp. 823–825.

Kihong Kim, et al. "On–Chip Wireless Interconnection with Integrated Antennas"; 2000 IEEE; pp. 20.2.1–20.3.4.

C. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993, pp. 127–130.

H. Nagata, "A Preliminary Consideration of the Growth Behaviour of CeO$_2$, SrTiO$_3$ and SrVO$_3$ Films on Si Substrate," *Thin Solid Films,* 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Journ. Appl. Phys.,* vol. 30, No. 6B, Jun. 1001, pp. L1136–L1138.

Kado et al., "Heteroepitaxial Growth of SrO Films on Si Substrates," *J. Appl. Phys.,* 61(6), Mar. 15, 1987, pp. 2398–2400.

H. Ishiwara et al., "Epitaxial Growth of Perovskite Type Oxide Films on Substrates"; *Materials Research Symposium Proceedings,* vol. 220, pp. 595–600, Apr. 29, May 3, 1991.

J.K. Abrakwah, et al.; "A Manufacturable High–Speed Low––Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993; pp. 67–150.

Jayshri Sabarinathat, et al.; "Submicron three–dimensional infrared GaAs/Al$_x$O$_y$–based photonic crystal using single–step epitaxial growth"; Applied Physics Letters, vol. 78, No. 20, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6, Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, 10 Aug. 1998; pp. 780–782.

Lucent Technologies, Inc. "Arrayed Waveguide Grating Multiplexer/Demultiplexer"; Jan. 2000; 4 pages.

Hisashi Schichijo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE: GaAs IC Symposium 239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al.; "Metamorphic InAlA/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Arnold Leitner et al; "Pulsed Laser Deposition of Superconducting Strontium Titanate Thin–Films"; Session K11–Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on –Al$_2$O$_3$, Si and 6H–SIC by pulsed laser deposition"; Thin Solid Films 299 (1997), pp. 94–103.

T. Warren Weeks, et al.; "GaN thin films deposited via organometallic vapor phase epitaxy on (6H)–SiC(0001) using high–temperature monocrystalline AlN buffer layers" 320 Applied Physics Letters, vol. 67, No. 3, Jul. 17, 1995, pp. 1401–403.

Z. Yu, et al.; "Epitaxial oxide thin films on SI(001)*"; J. Vac. Sci. Technol. B. vol. 18, No. 4, Jul./Aug. 2000; pp. 2139–2145.

Gentex Corporate Website; Photoelectric Smoke Detectors—How They Work; 2001.

Jeffrey B. Casady, et al.; "A Hybrid 6H–SiC Temperature Sensor Operational from 25 C to 500 C"; IEEE Transactions on Components, Packaging, and Manufacturing Technology—Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

G. Vogg et al.; "Epitaxial alloy films of zintl–phase Ca9Si1–xGex)2"; Journal of Crystal Growth 223 (2001); pp. 573–576.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, pp. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology*, 1995 May/Jun., vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of SrTiO$_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of BaTiO$_3$ and SrTiO$_3$ Thin Films on MgO," *Mat. Res. Soc. Symp. Proc.*, vol. 341, Apr. 1994, pp. 309–314.

McKee et al., "BaSi$_2$ and Thin Film Alkaline Earth Silicides on Silicon," *Appl Phys. Lett.*, 63(20), Nov. 1993, pp. 2818–2820.

McKee et al., "Surface Structures and the Orthorhombic Transformation of Thin Film BaSi$_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of SrTiO$_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline SrTiO$_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of Er$^3$–doped BaTiO$_3$ thin films"; Appl. Phys. Lett. 65 (1), Jul. 4, 1994, pp. 25–27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8, No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl Phys. 32(1999) R169–R177.

Wei Zhang et al.; "Stress Effect and Enhanced Magnetoresistance in La$_{0.67}$Ca$_{0.33}$MnO$_{3-\delta}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of materials combination for system–on–a chip preparation"; 1999 IEEE International SOI Conference, Oct. 1999; pp. 104–105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of BaTiO$_3$ Films on Si by Pulsed Laser Deposition"; Applied Physics Letters; Mar. 13, 1995; pp. 1331–1333.

Myung Bok Lee; "Formation and Characterization of Eptiaxial TiO$_2$ and BaTiO$_3$/TiO$_2$ Films on Si Substrate"; Japan Journal Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27,; No. 26; pp. 3592–3594.

K. Eisengbeiser; "Field Effect Transistors with SrTiO$_3$ Gate Dielectric on Si"; Applied Physics Letters; vol. 76, vol. 76, No. 10; Mar. 6, 2000; pp. 1324–1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in La$_{0.8}$Sr$_{0.2}$MnO$_3$/SrTiO$_3$/La$_{0.8}$Sr$_{0.2}$MnO$_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using YbaCuO/CeO$_2$ Heterostructures"; Physica C; vol. 282–287, No. 2003; Aug. 1, 1997; pp. 1231–1232.

Shogo Imada et al; "Epitaxial Growth of Ferroelectric YmnO$_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al; "Temperature Dependence of the Magnetization Reversal in Co(fcc)–BN–Co(poly hcp) Structures"Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of ZnO/SiO$_2$/Si Monolithic Integrated Progrmmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication: John Wiley & Sons.

Joseph W. Goodman et al; "Optical Interconnectiosn For VLSI Systems"; Proceedings of the IEEE, vol. 72, No. 7 Jul. 1984.

Fathimulla et al.; "Monolithic Integration of InGaAs/InAIAs MODFETs and RTDs on InP–bonded–to–Si Substrate", Fourth International Conference on Indium Phosphide and Related Materials, Newport, RI, USA; Apr. 21–24, 1992; pp. 167–170; XP000341253; IEEE, New York, NY, USA; ISBN:0–7803–0522–1.

H. Takahashi et al.; "Arraryed–Waveguide Grating For Wavelength Division Multi/Demultiplexer With Nanometre Resolution"; Electronics Letters; vol. 26, No. 2, 18th Jan. 1990.

Pierret R.F.; "1/J–FET and MESFET"; Field Effect Devices; MA, Addison–Wesley; 1990; pp. 9–22.

M. Schreiter, et al.; "Sputtering of Self–Polarized PXT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequencey Control, vol. 38, No. 6, Nov. 1991.

A.J. Moulson et al.; "Electroceramics Materials Properties Applications"; Chapman & Hall; pp. 366–369.

P.A. Langjahr et al; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented (Pb,La)(Zr,Ti)$O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

S.N. Subbarao et al.; "Monolithic PIN Photodetector and FET Amplifier on GaAs–os–Si"; IEEE, GaAs IC Symposium–163–166; 1989.

T.A. Langdo et al.; "High Quality Ge on Si by Epitaxial Necking"; Applied Physics Letters; vol. 76, No. 25: pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Si: Progress and Potential Applications"; Mat. Res. Soc. Symp. Proc.; pp. 15–30; 1987.

G.J.M. Dormans, et al.; "PbTiO/$_3$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 380–387.

S.K. Tweksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20; Jun. 19–21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layer and Its Impact on Device Integration"; TICS 4, Prof. Sands. MSE 225, Apr. 12, 2002; pp. 1–5.

S.A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAlAs Power HBTs for Mobile Communications"; Microwave Symposium Digest; 1993 IEEE; vol. 2; pp. 549–552.

Y. Ota et al.; "Application of Heterojunction FET to Power Amplifier for Cellular Telephone"; Electronics Letters; 26th May 1994; vol. 30, No. 11; pp. 906–907.

Keiichi Sakuno et al; "A 3.5W HBT MMIC Power Amplifier Module for Mobile Communications"; IEEE 1994; Microwave and Millimeter–Wave Monolithic Circuits Symposium; pp. 63–66.

Mitsubishi Semiconductors Press Release (GaAs FET's) Nov. 8, 1999 pp. 1–2.

R.J. Matyi et al; "Selected Area Heteroepitaxial Growth of GaAs on Silicon for Advanced Device Structures"; 2194 Thin Solid Films; 181 (1989) Dec. 10; No.1; pp. 213–225.

K. Nashimoto et al; "Patterning of Nb, LaOnZr, TiO3 Waveguides for Fabricating Micro–Optics Using Wet Etching and Solid–Phase Epitaxy"; Applied Physics Letters; vol. 75, No. 8; Aug. 23, 1999; pp. 1054–1056.

Bang–Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837–840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth and Properties of Ferromagnetic Co–Doped TiO2 Anatase"; Applied Physics Letters; vol. 79, No. 21; Nov. 19, 2001; pp. 3467–3469.

\* cited by examiner

METHOD OF REMOVING AN AMORPHOUS OXIDE FROM A MONOCRYSTALLINE SURFACE

RELATED APPLICATIONS

This application is a continuation-in-part of U.S. patent application Ser. No. 09/502,023 filed on Feb. 10, 2000, which application is incorporated herein by reference.

FIELD OF THE INVENTION

This invention relates generally to a method for preparing a monocrystalline surface for deposition of a monocrystalline oxide thereon, and more particularly to a method for removing an amorphous oxide from a monocrystalline surface.

BACKGROUND OF THE INVENTION

Single crystal oxides, such as perovskites, are attractive materials due to their simple crystal structures and unique ferroelectric, dielectric, and optical properties. The high quality epitaxial growth of single crystal oxides on monocrystalline substrates, such as silicon, is desirable for numerous device applications, such as optical waveguides, ferroelectrics, nonvolatile high density memory devices, MOS devices and the like.

For many years, attempts to grow monocrystalline oxides on monocrystalline substrates have proven difficult because of the easily-formed amorphous oxide layer that forms on the substrate surface in an oxygen atmosphere. This amorphous oxide layer prevents high quality growth of monocrystalline oxides on monocrystalline substrates. Because an ordered and stable substrate surface is needed to facilitate the growth of high quality monocrystalline oxide layers, it is desirable to remove the amorphous oxide layer from the surface of the substrate before depositing the monocrystalline oxide layer.

Accordingly, a method of removing an amorphous oxide layer from a monocrystalline substrate is needed. In addition, a method for forming an ordered and stable surface on a monocrystalline substrate for subsequent growth of a monocrystalline oxide layer is needed.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
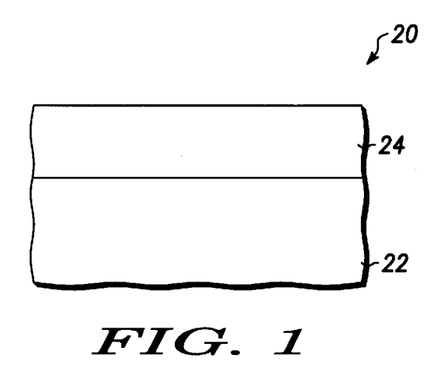
FIG. 1 illustrates, in cross section, a semiconductor structure having a monocrystalline substrate and a native amorphous oxide formed thereon.

A method for removing an amorphous oxide from the surface of a monocrystalline substrate and producing an ordered surface on the substrate for subsequent growth of a monocrystalline oxide is illustrated in FIGS. 1–6. FIG. 1 illustrates schematically, in cross section, a portion of a semiconductor structure 20 that includes a monocrystalline substrate 22 having an amorphous oxide layer 24. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers such materials commonly found in the semiconductor industry.

Substrate 22, in accordance with an embodiment of the invention, is a monocrystalline semiconductor or compound semiconductor material, such as, for example, materials from Group IV of the periodic table. Examples of Group IV semiconductor materials include silicon, germanium, mixed silicon and germanium, mixed silicon and carbon, mixed silicon, germanium and carbon, and the like. Preferably, substrate 22 is a wafer containing silicon or germanium, and most preferably is a high quality monocrystalline silicon wafer having a (100) orientation, as used in the semiconductor industry. The substrate is oriented on axis or, at most, about 6° off axis.

At least a portion of the semiconductor substrate 22 has a bare surface, although other portions of the substrate may encompass other structures. The term "bare" in this context means that the surface in the portion of the substrate has been cleaned to remove any oxides, contaminants, or other foreign material. As is well known, bare substrates such as silicon may be highly reactive and may readily form native amorphous oxide layer 24. The term "bare" is intended to encompass such a native oxide layer. A thin oxide may also be intentionally grown on the semiconductor substrate, although such a grown oxide is not essential to the process in accordance with the invention. In order to epitaxially grow a monocrystalline oxide layer overlying the monocrystalline substrate, the native amorphous oxide layer 24 must first be removed to expose the crystalline structure of the underlying substrate.

Figure 2:
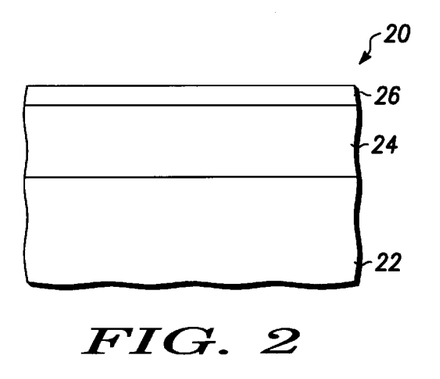
FIG. 2 illustrates, in cross section, a passivation material layer formed overlying the native amorphous oxide layer of the semiconductor structure of FIG. 1.

The following process is preferably carried out by ultra high vacuum (UHV) molecular beam epitaxy (MBE), although other epitaxial processes may also be used in accordance with the present invention. In one exemplary embodiment of the invention, monocrystalline substrate 22 is positioned with a processing chamber of an UHV MBE. Monocrystalline substrate 22 may then be heated below the sublimation temperature of the amorphous oxide layer 24, preferably to a temperature of about 500° C., although it will be appreciated that heating Substrate 22 at this point in the process is not essential to the present invention. Referring to FIG. 2, a passivation material layer 26 is deposited overlying the MBE. The passivation material layer 26 may comprise alkali or alkaline earth metals, combinations of alkali and/or alkaline earth metals, the oxides of alkali or alkaline earth metals or the combinations of oxides of alkali and/or alkaline earth metals. Examples of materials suitable for passivation material layer 26 include strontium, strontium oxide, barium, barium oxide, a combination of strontium and barium, and the like. The MBE process is initiated by opening shutters in the MBE apparatus to expose one or more sources of the passivation material, creating a flux of the passivation material. The flux of the passivation material may be set depending on the melting point and vapor pressure of the passivation material. Typically, the flux of the material is in the range of about 1 Angstrom/minute to about 10 Angstroms/minute. In a preferred embodiment of the invention, the flux of the passivation material may be terminated when passivation material layer 26 has grown to its desired thickness. Alternatively, a continuous flux of the passivation material may be provided during the process. If a continuous flux of the passivation material is provided during processing, it may be desirable to provide in situ monitoring of the thickness of passivation material layer 26, such as by a reflection high energy electron diffraction (RHEED) crystal oscillation thickness monitor, so that the thickness of passivation material layer 26 does not reach a thickness that would prevent or otherwise adversely affect removal of amorphous oxide layer 24. Preferably, about one to five monolayers of passivation material layer 26, and more preferably about one to 2 monolayers of passivation material layer 26, is deposited overlying the amorphous oxide layer 24, although it will be appreciated that passivation material layer 26 may be of any thickness suitable for facilitating the removal of amorphous oxide layer 24.

Figure 3:
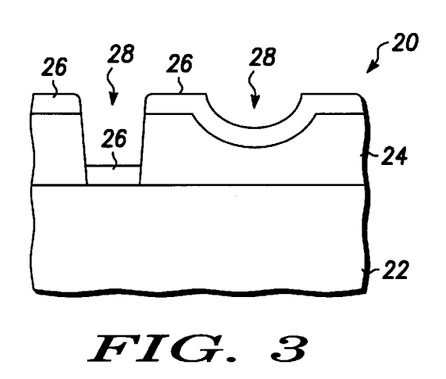
FIG. 3 illustrates, in cross section, the semiconductor structure of FIG. 2 in which voids have formed in the native amorphous oxide layer.
Figure 4:
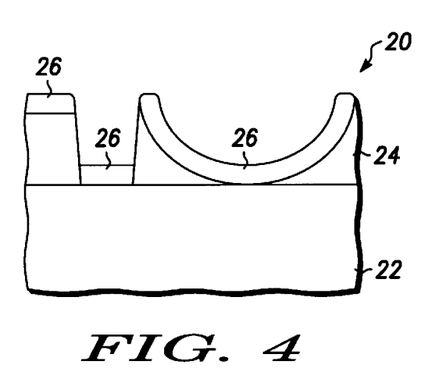
FIG. 4 illustrates, in cross section, the semiconductor structure of FIG. 3 wherein the material of the passivation layer has passivated exposed portions of the monocrystalline substrate.
Figure 5:
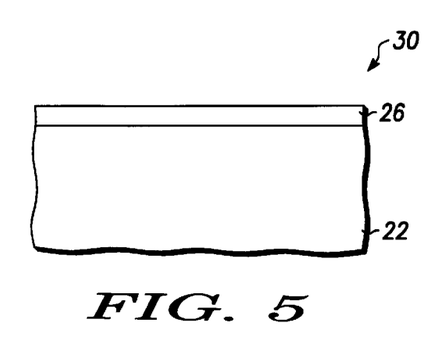
FIG. 5 illustrates, in cross section, the semiconductor structure of FIG. 4 wherein the native amorphous oxide layer has been removed and the monocrystalline substrate has been passivated by the passivation layer.

The substrate is then heated to a temperature in the range of from about 700° C. to about 900° C. FIG. 3 illustrates, in cross section, structure 20 upon being heated to about 700° C. or higher. At this temperature, molecules from the amorphous oxide layer 24 are liberated from the surface of monocrystalline substrate 22, forming voids 28 in amorphous oxide layer 24. The passivation material layer 26 overlying amorphous oxide layer 24 facilitates liberation of the amorphous oxide layer from the surface of the monocrystalline substrate 22, thus increasing the rate of removal of the amorphous oxide layer. The passivation material serves as a catalyst that promotes the ejection of electrons from one or both of the passivation material and the amorphous oxide. This results in a dipole field between the passivation material and the amorphous oxide which causes the amorphous oxide to be in an activated state. Accordingly, the amorphous oxide more readily decomposes into volatile species that are liberated from the monocrystalline substrate surface. In addition, portions of the monocrystalline substrate 22 exposed during formation of the voids 28 are passivated by the passivation material of passivation material layer 26, as illustrated in FIG. 4. Without the presence of the passivation material from passivation material layer 26, the voids would continue to grow into the monocrystalline substrate 22, forming pits in monocrystalline substrate 22. As the process continues, the amorphous oxide layer 24 continues to be liberated from the surface of monocrystalline substrate 22, which in turn continues to be passivated by the passivation material of passivation material layer 26. FIG. 5 illustrates, in cross section, structure 30, which results from the above-described process. At conclusion of the process, substantially all of amorphous oxide layer 24 has been liberated from monocrystalline substrate 22 and passivation material layer 26 provides an ordered and stable surface overlying monocrystalline substrate 22.

Figure 6:
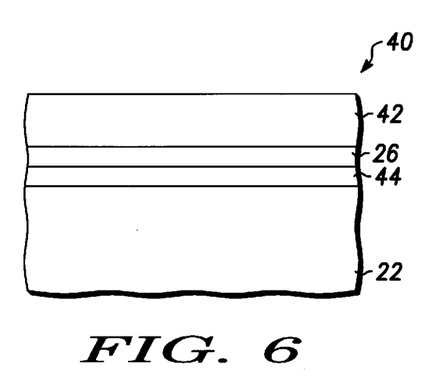
FIG. 6 illustrates, in cross section, the semiconductor structure of FIG. 5 wherein a monocrystalline oxide has been grown overlying the monocrystalline substrate.

Following the removal of the amorphous oxide layer 24 from the surface of the substrate, the substrate may be cooled to a temperature in the range of about 200–800° C., preferably 350–450° C., and a monocrystalline oxide layer 42, as illustrated in FIG. 6, may then be epitaxially grown overlying passivation material layer 26 to form structure 40. Monocrystalline oxide layer 42 is preferably selected for its crystalline compatibility with the underlying monocrystalline substrate 22. Materials that are suitable for monocrystalline oxide 42 include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Most of these materials are insulators, although strontium ruthenate, for example is a conductor. Generally, these materials are metal oxides or metal nitrides, and more particularly, these metal oxide or nitrides typically include at least two different metallic elements.

Structure 40 may also include an amorphous interface layer 44, which is preferably an oxide formed by the oxidation of the surface of substrate 22 during or after the growth of monocrystalline oxide layer 42. The thickness of layer 44 may be sufficient to relieve strain attributed to mismatches between the lattice constants of monocrystalline substrate 22 and monocrystalline oxide layer 42. Typically, layer 44 has a thickness in the range of approximately 0.5–5 nm.

The following example illustrates a process, in accordance with one embodiment of the invention, for fabricating a semiconductor structure such as the structure depicted in FIG. 6. The process starts by providing a monocrystalline semiconductor substrate comprising silicon or germanium. In accordance with a preferred embodiment of the invention, the semiconductor substrate is a silicon wafer having a (100) orientation. The substrate is oriented on axis or, at most, about 6° off axis. At least a portion of a silicon substrate has a native amorphous silicon oxide layer. In order to epitaxially grow a monocrystalline oxide layer overlying the monocrystalline silicon substrate, the native amorphous silicon oxide layer must first be removed to expose the crystalline structure of the underlying silicon substrate. The process is preferably performed in an UHV MBE apparatus, although other epitaxial processes may also be used in accordance with the present invention. The silicon substrate is positioned within the processing chamber of an UHV MBE unit and heated to a temperature below the sublimation temperature of silicon oxide, preferably about 500° C. Shutters in the MBE apparatus are then opened to expose one or more strontium sources to produce a flux of strontium preferably in the range of about 1 Angstrom/minute to about 10 Angstroms/minute and more preferably about 4 Angstroms/minute. One to two monolayers of strontium is then deposited overlying the native amorphous oxide layer. Alternatively, three to four monolayers of strontium oxide may be deposited on the silicon substrate surface by exposing one or more strontium sources in an atmosphere having an oxygen partial pressure in the range of from about $1 \times 10^{-8}$ torr to $1 \times 10^{-7}$ torr.

The silicon substrate is then heated to a temperature of at least 720° C. The strontium (or strontium oxide) serves as a catalyst that increases the rate of removal of the silicon oxide from the surface of the silicon substrate. The strontium promotes the ejection of electrons from one or both of the strontium layer and the silicon oxide layer. This results in a dipole field between the strontium layer and the silicon oxide layer. The dipole field weakens the Si—O bonds of the silicon oxide layer which causes the silicon oxide layer to be in an activated state. Accordingly, the silicon oxide more readily decomposes into a volatile species that is liberated from the monocrystalline silicon substrate surface according to the following reaction:

$SiO_2 + Sr(\text{or } SrO) \rightarrow SiO(g) + O^+ + e^- + Sr(\text{or } SrO)$.

As the silicon oxide is liberated from the silicon substrate surface, voids, such as voids 28 illustrated in FIG. 3, begin to form in the native amorphous silicon oxide layer. Without strontium (or strontium oxide) overlying the silicon oxide layer, the voids would continue to grow into the silicon substrate, resulting in pits in the silicon surface. However, the strontium serves to passivate the exposed silicon substrate surface so further etching of the silicon substrate will be reduced or eliminated. Accordingly, a strontium-terminated silicon (100) substrate with an ordered 2×1 structure results. If an ordered (2×1) structure has not been achieved at this stage of the process, the structure may be exposed to additional strontium until an ordered (2×1) structure is obtained. If strontium oxide is used to passivate the silicon substrate surface, the process may be continued so that the strontium oxide reacts with the silicon substrate to form volatile SiO, leaving a strontium-terminated silicon substrate. This strontium layer forms a template for the subsequent growth of an ordered monocrystalline oxide layer.

Following the removal of the amorphous silicon oxide from the surface of the silicon substrate, in accordance with one embodiment of the invention, the substrate is cooled to a temperature in the range of about 200–800° C., preferably 350–450° C., and a monocrystalline oxide layer of strontium titanate is grown on the template layer by MBE. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.1–0.8 nm per minute, preferably about 0.3–0.5 nm per minute. After initiating growth of the strontium titanate, the partial pressure of oxygen is increased above the initial minimum value. The stoichiometry of the strontium titanate can be controlled during growth by monitoring RHEED patterns and adjusting the fluxs. The overpressure of oxygen causes the growth of an amorphous silicon oxide interface layer at the interface between the underlying substrate and the strontium titanate layer. This step may be applied either during or after the growth of the $SrTiO_3$ layer. The growth of the silicon oxide interface layer results from the diffusion of oxygen through the strontium titanate layer to the interface where the oxygen reacts with silicon at the surface of the underlying substrate. The strontium titanate grows as an ordered (100) monocrystal with the (100) crystalline orientation rotated by 45° with respect to the underlying silicon substrate. Strain that otherwise might exist in the strontium titanate layer because of the small mismatch in lattice constant between the silicon substrate and the growing crystal is relieved in the amorphous silicon oxide interface layer.

The method described above illustrates a method for removing an amorphous silicon oxide from a silicon substrate and for forming a semiconductor structure including a silicon substrate and an overlying monocrystalline oxide layer comprising strontium titanate by the process of molecular beam epitaxy. The process can also be carried out by chemical vapor deposition (CVD), metal organic chemical vapor deposition, (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, native amorphous oxides may be removed from other monocrystalline substrates such as germanium, mixed silicon and germanium, mixed silicon and carbon, mixed germanium and carbon, mixed silicon, germanium and carbon, and the like. In addition, by a similar process other monocrystalline oxide layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide, can also be grown.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method of removing an amorphous oxide from a surface of a monocrystalline substrate, the method comprising:

depositing a passivation material overlying said amorphous oxide; and heating said surface so that said amorphous oxide layer decomposes into at least one volatile species that is liberated from said surface.

2. The method of claim 1, wherein said heating is performed after said depositing.

3. The method of claim 1, wherein said heating is performed during said depositing.

4. The method of claim 1, further comprising epitaxially growing a monocrystalline oxide layer overlying said surface of said monocrystalline substrate.

5. The method of claim 4, further comprising forming an amorphous oxide interface layer overlying said monocrystalline substrate and underlying said monocrystalline oxide layer.

6. The method of claim 1, further comprising heating said monocrystalline substrate to a temperature below the sublimation temperature of said amorphous oxide layer before said depositing.

7. The method of claim 1, wherein said monocrystalline substrate comprises one of silicon, germanium, a combination of silicon and germanium, a combination of silicon and carbon, and a combination of silicon, germanium and carbon.

8. The method of claim 1, wherein said passivation material comprises at least one of an alkali earth metal, an alkali earth metal oxide, an alkaline earth metal, and an alkaline earth metal oxide.

9. The method of claim 8, wherein said passivation material comprises one of strontium and strontium oxide.

10. The method of claim 4, wherein said monocrystalline oxide comprises at least one of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide.

11. The method of claim 1, wherein said heating comprises heating to a temperature in the range of from about 700° C. to about 900° C.

12. The method of claim 1, further comprising heating said surface so that said passivation material passivates said monocrystalline substrate and forms an ordered layer thereon.

13. The method of claim 1, wherein said depositing is performed by the process of ultra high vacuum molecular beam epitaxy.

14. A method of fabricating a semiconductor structure utilizing a monocrystalline substrate having an amorphous oxide formed thereon, the method comprising:
    depositing a passivation material overlying said substrate and said amorphous oxide;
    heating said monocrystalline substrate so that said amorphous oxide layer decomposes into at least one volatile species that is liberated from said monocrystalline substrate; and
    depositing a monocrystalline oxide overlying said monocrystalline substrate.

15. The method of claim 14, wherein said heating is performed after said depositing.

16. The method of claim 14, wherein said heating is performed during said depositing.

17. The method of claim 14, said passivation material comprising at least one of an alkali metal, an alkali metal oxide, an alkaline metal and an alkaline metal oxide.

18. The method of claim 14, further comprising forming an amorphous oxide interface layer overlying said monocrystalline substrate and underlying said monocrystalline oxide layer.

19. The method of claim 14, further comprising heating said monocrystalline substrate to a temperature below the sublimation temperature of said amorphous oxide layer before said depositing.

20. The method of claim 14, said monocrystalline substrate comprising one of silicon, germanium, a combination of silicon and germanium, a combination of silicon and carbon, and a combination of silicon, germanium and carbon.

21. The method of claim 17, said passivation material comprising one of strontium and strontium oxide.

22. The method of claim 14, wherein said monocrystalline oxide comprises at least one of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide.

23. The method of claim 14, wherein said heating comprises heating to a temperature in the range of from about 700° C. to about 900° C.

24. The method of claim 14, further comprising heating said monocrystalline substrate so that said passivation material passivates said monocrystalline substrate and forms an ordered layer thereon.

25. The method of claim 14, wherein said depositing is performed by the process of ultra high vacuum molecular beam epitaxy.

26. A method of removing an amorphous oxide from a monocrystalline substrate, the method comprising:
    depositing a passivation material overlying said monocrystalline surface; and
    heating said monocrystalline substrate,
    wherein said passivation material promotes the ejection of electrons from at least one of the passivation material and the amorphous oxide, said ejection of electrons producing a dipole field between said passivation material and the amorphous oxide facilitating the decomposition of the amorphous oxide into volatile species and resulting in the passivation of the monocrystalline substrate by the passivation material.

27. The method of claim 26, further comprising epitaxially growing a monocrystalline oxide layer overlying said surface of said monocrystalline substrate.

28. The method of claim 26, further comprising heating said monocrystalline substrate to a temperature below the sublimation temperature of said amorphous oxide before said depositing.

29. The method of claim 26, wherein said monocrystalline substrate comprises silicon and said passivation material comprises one of strontium and strontium oxide.

* * * * *